United States Patent [19]
Cecil et al.

[11] 3,954,551
[45] May 4, 1976

[54] METHOD OF PULLING SILICON RIBBON THROUGH SHAPING GUIDE

[75] Inventors: Olin B. Cecil, Dallas; Paul D. Maycock, Richardson, both of Tex.

[73] Assignee: Texas Instruments Incorporated, Dallas, Tex.

[22] Filed: July 17, 1974

[21] Appl. No.: 489,303

[52] U.S. Cl. .............................. 156/608; 156/617; 23/273 SP
[51] Int. Cl.² ................ B01J 17/24; C01B 33/02
[58] Field of Search ...... 23/273 SP, 273 SC, 273 V, 23/301 SP, 301 SC; 156/607, 608, 615, 617, 618

[56] References Cited
UNITED STATES PATENTS

| | | | |
|---|---|---|---|
| 2,809,136 | 10/1957 | Mortimer | 23/273 SP |
| 3,031,275 | 4/1962 | Shockley | 23/301 SP |
| 3,124,489 | 3/1964 | Vogel, Jr. et al. | 23/273 SP |
| 3,265,469 | 8/1966 | Hall | 23/301 SP |
| 3,453,352 | 7/1969 | Goundry | 23/273 SP |
| 3,617,223 | 11/1971 | Boatman | 425/461 |

*Primary Examiner*—Curtis P. Ribando
*Attorney, Agent, or Firm*—Harold Levine; James T. Comfort; Gary C. Honeycutt

[57] ABSTRACT

A ribbon of semiconductor material is formed by supplying powdered semiconductor material at the bottom of a rectangular tube shaping guide while heating the semiconductor material in the region of the guide to produce a molten body of semiconductor material within the guide. The upper surface of the melt is contacted with a seed ribbon which is drawn upward while maintaining the supply of semiconductor material adjacent to the bottom of the guide.

5 Claims, 4 Drawing Figures

METHOD OF PULLING SILICON RIBBON THROUGH SHAPING GUIDE

This invention relates to the manufacture of semiconductor crystals utilized in semiconductor technology, and more particularly, to the growth of material such as silicon in ribbon form from powdered feed stock.

Typically, semiconductor materials used in the manufacture of transistors, integrated circuits and the like have been provided from crystals which are grown by pulling them from a melt of the semiconductor material. Such crystals generally are in cylindrical form. Crystals typically 2 or more inches in diameter are thus grown. After the crystal has been thus formed, it is sliced into thin wafers. The wafers are then processed by treating the surface thereof through the various procedural steps which lead to the formation of the desired devices on or in the surface of the wafer. The devices may be transistors or integrated circuits or the like. The wafer is then scribed and broken into multi chips each of which may contain single or multi elements thereon. Such chips typically are of the order of less than 0.2 inch of maximum dimension and of thickness of about 0.006 inch.

In such operations, approximately 40% of the crystal material is waste, occasioned by the various processing operations including sawing the crystal into slices. The present invention is directed towards the growth of material in ribbon form. Prior systems for forming semiconductor ribbons are disclosed in U.S. Pat. Nos. 3,453,352 and 3,617,223 wherein a solid semiconductor is melted and a ribbon is pulled through a die about the melt zone.

The present invention is directed to operations wherein the feed stock is powdered or granular. Ribbons thus preferably are of the order of several inches wide (for example, 2.0 inches) and fractions of an inch thick (for example, from 0.010 to 0.025 inches). Such ribbons may then be scribed transversely and separated into chips without the waste involved in the sawing operation conventionally employed in utilization of cylindrical crystals. Avoided are problems involving the solid source material.

In accordance with the present invention, semiconductor ribbons are formed by maintaining a fluidized bed of powdered semiconductor material and establishing a flow upward from the surface of the bed in a constrained ribbon shape. At least the upper portion of the ribbon shaped flow is maintained in a molten condition while constraining th melt in rectangular configuration by surface tension while drawing material from the melt at the upper surface thereof by a ribbon shaped seed to establish a solid-liquid interface at the upper extremity of the constrained zone.

In a more specific aspect, a monocrystalline ribbon of semiconductor material is formed by supplying powdered semiconductor material at the bottom of a rectangular tube shaping guide having an aperture substantially corresponding to the cross-sectional dimension of the monocrystalline ribbon to be produced. The semiconductor material in the region of the guide is heated to rpodce a molten body of semiconductor material within the guide. The upper surface of the melt is contacted with a seed ribbon, which is then drawn upward while maintaining the supply of powdered semiconductor material adjacent to the bottom of the guide.

The novel features believed characteristic of the invention are set forth in the appended claims. The invention itself, however, as well as further objects and advantages thereof, will best be understood by reference to the following detailed description of an illustrative embodiment taken in conjunction with the accompanying drawings, in which:

The invention generally encompasses use of a fluidized bed of powdered semiconductor such as silicon as a feed stock for a molten zone to form a ribbon. The particle distribution of the fluidized bed can be shaped thereby eliminating shaping guides required by prior approaches. A ribbon shaped semiconductor seed is drawn from a molten fluid bed. A molten zone is maintained by energy from means such as an RF coil encircling the molten zone. A stream of air is directed upward from around the seed. The feed stock is of laminar flow and is fluidized for flow to the bottom of a rectangular quartz tube. The particles melt as they feed upward. A single crystal will be constrained to the availability of material from the laminar bed at the top of the tube, thereby shaping the crystal. The feed powder is caused to come into contact with a molten body thereof which in turn contacts the lower end of a seed which is withdrawn slowly from the molten zone. The invention eliminates the need for maintaining a large mass of molten material at the correct temperature.

Figure 1:
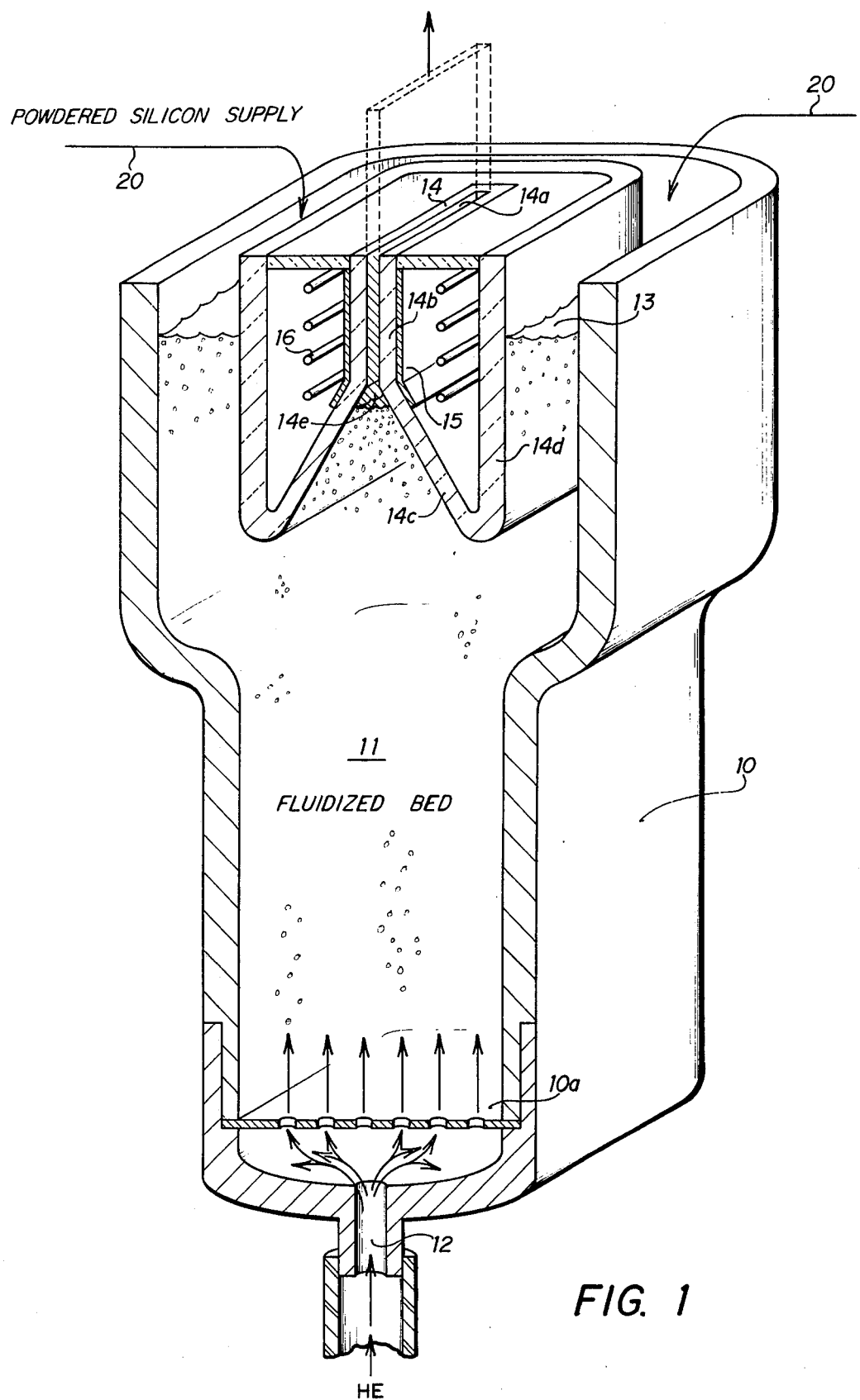
FIG. 1 is a sectional view of an embodiment of the present invention.

Referring now to FIG. 1, there is illustrated a container 10 in which there is maintained a fluidized bed of silicon 11. The silicon 11 in the container 10 is maintained fluidized by the introduction of a suitable gas, such as helium, by way of the inlet 12. The gas through inlet 12 travels upward through the container 10 continually to maintain the motion of the bed towards the upper boundary 13. At the upper boundary 13 there is provided a quartz tube 14 which is of rectangular shape, typically having a center opening through the tube several inches wide (for example, 2.0 inches) and fractions of an inch thick (for example, from 0.010 to 0.025 inches).

Figure 2:
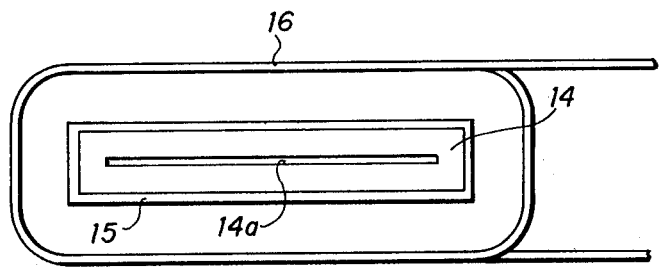
FIG. 2 is a top view of portions of the system of FIG. 1.

As best shown in FIG. 2, a quartz tube 14 has the center thin rectangular opening 14a extending therethrough with an exterior metallic coating 15.

Surrounding the tube 14 and the metallic coating 15 is an RF coil 16, which is provided for the transfer of heat to the coating 15, which in turn heats the tube 14. As best shown in FIG. 1, the tube 14 has vertical wall sections 14b terminating at the upper end thereof adjacent to the slot 14a, and continuing at the lower end thereof in downwardly and outwardly diverging walls 14c. While the tube 14 in its upper section is truly rectangular, the lower section formed by walls 14c may be oval shaped forming an upwardly directed funnel shaped structure. Walls 14c then are connected to upwardly directed side walls 14d. A closure plate is provided at the top. The enclosure thus formed inside the wall portions 14d and outside the wall portions 14b houses RF coil 16, which is provided for heating the metallic coating 15. The energy thus provided serves to heat the tube walls 14d so that powdered silicon maintained in the region 14e will become molten. The molten material in zone 14e draws up to the slot 14a so that it can be contacted at the upper end of slot 14b by a seed. The radio frequency inductance heating is thus provided to maintain molten the material within the slot 14a. The melt is constrained and shaped by the slot 14a. The growth of the ribbon is then initiated by lowering an oriented single crystal seed through or to the top of the guide slot 14a and withdrawing it slowly. Liquid silicon is drawn through the slot 14a. Just above the end of the tube 14 it becomes solid. The material produced is free of dislocations and edge imperfections and may have a surface equal to that of a mechanically polished slice. The seed holder and the drawing mechanism may be of the type shown in U.S. Pat. Nos. 3,453,352 or 3,617,223.

Returning again to FIG. 1, it will be noted that flow of gas is directed through baffle plate 10a to distribute the gas through the body 11 of silicon material. The fluidization techniques for maintaining the powdered silicon feed adjacent to the region 14e is in general well known to those skilled in the art. Such fluidization techniques will, therefore, be employed. A suitable supply system can be provided to maintain the supply of silicon in the unit 10 at an optimum level. Such supply can be indicated by the arrows 20.

Figure 3:
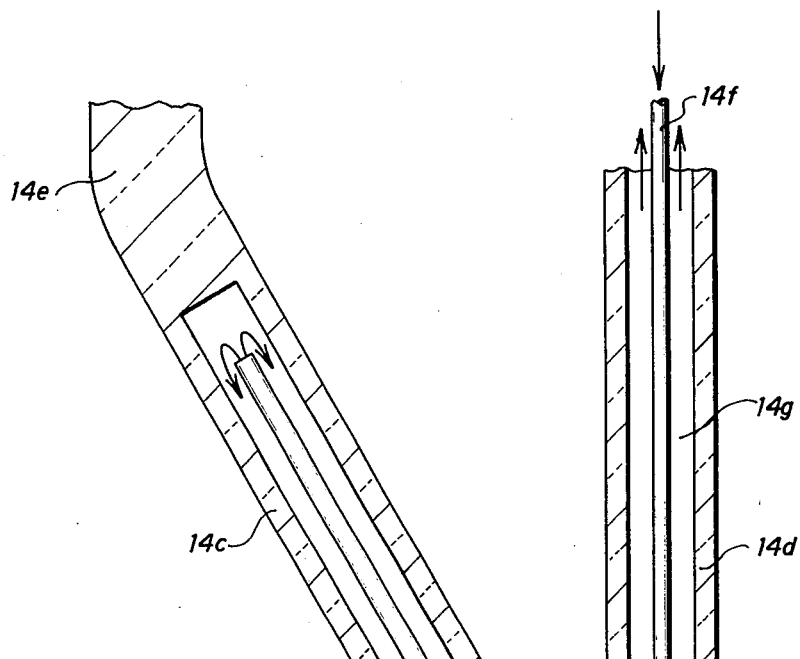
FIG. 3 is an enlarged view of a cooling system employed in the system of FIG. 1.

FIG. 3 illustrates a preferred function for the walls 14d and 14c of the tube 14. Walls 14c and 14d are maintained cool by a flow or air or coolant therein to a point adjacent to zone 14e. In this embodiment, a cold finger structure is provided with a tube 14f extending into a passage 14g inside the walls 14c and 14d. Air or coolant flows out of the end of the tube 14f adjacent to the zone 14e and then courses back along the passage 14g to an exhaust port (not shown). FIG. 3 indicates the conditions preferably maintained to control the heat distribution in the system. Preferably, the zone 14e will be molten immediately below the end of the slot 14a and is maintained in contact with the upwardly directed powdered silicon 11. As the ribbon is drawn from the top of the melt at the mouth of slot 14a, the zone 14e will be replenished.

Figure 4:
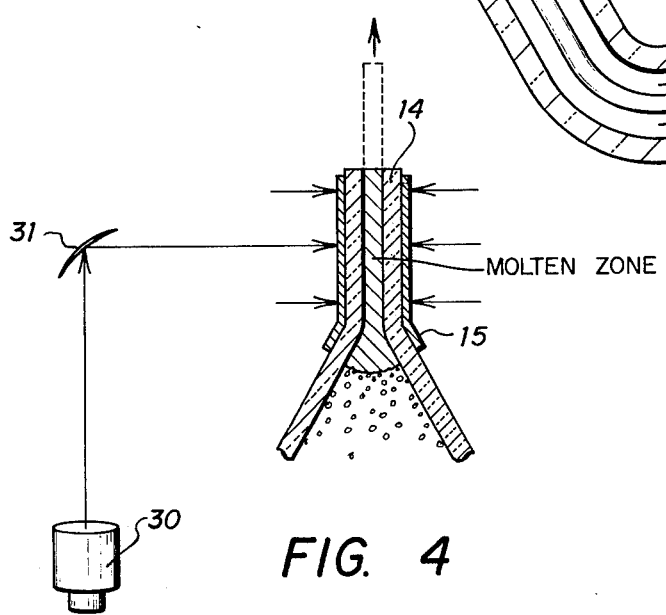
FIG. 4 illustrates a system in which heating is accomplished by use of radiant energy.

Referring now to FIG. 4, there is illustrated a method of heating the tube 14 with its jacket 15 utilizing radiant energy. A source 30 is provided to direct energy onto a lens 31 so that the energy will be directed to and absorbed by the coating 15. While only on lens has been shown, a pair of lenses may be employed in order to secure the desired distribution of heat around the tube 14, thereby maintaining a melt inside tube 14.

While the invention has been described in connection with the formation of silicon ribbon, it will be appreciated that other semiconductor materials may be employed other than silicon and that the present invention is not limited to use of silicon as a feed stock.

Having described the invention in connection with certain specific embodiments thereof, it is to be understood that further modifications may now suggest themselves to those skilled in the art and it is intended to cover such modifications as fall within the scope of the appended claims.

We claim:

1. The method of continuously forming a monocrystalline ribbon of semiconductor material comprising:
   a. maintaining a fluidized supply of powdered semiconductor material at the bottom of a rectangular tube shaping guide having an aperture substantially corresponding to the cross-sectional dimension of the monocrystalline ribbon to be produced,
   b. heating said semiconductor material in the region of said guide to produce a molten body of said semiconductor material within said guide,
   c. contacting the upper surface of said melt with a seed ribbon, and
   d. drawing said seed ribbon upward while maintaining the supply of said semiconductor material adjacent to the bottom of said guide.

2. The method set forth in claim 1 in which the lower extremities of said guide are temeperature controlled by flow of a coolant thereto.

3. The method according to claim 1 wherein radio frequency energy is coupled to said guide to heat the same to cause said material to become molten.

4. The method according to claim 1 wherein radiant energy is focused onto said guide to heat the same and cause said material to become molten.

5. The method according to claim 1 wherein the supply of semiconductor material at the bottom of said rectangular tube is shaped to form a dome the tip of which is directed to the aperture of said guide.

* * * * *